(12) United States Patent
Chang et al.

(10) Patent No.: US 8,609,240 B2
(45) Date of Patent: Dec. 17, 2013

(54) COATED ARTICLE AND METHOD FOR MAKING SAME

(75) Inventors: Hsin-Pei Chang, New Taipei (TW);
Wen-Rong Chen, New Taipei (TW);
Huann-Wu Chiang, New Taipei (TW);
Cheng-Shi Chen, New Taipei (TW);
Kao-Yu Liao, New Taipei (TW);
Xiao-Qing Xiong, Shenzhen (CN)

(73) Assignees: Hong Fu Jin Precision Industry (ShenZhen) Co., Ltd, Shenzhen (CN);
Hon Hai Precision Industry Co., Ltd., New Taipei (TW)

( * ) Notice: Subject to any disclaimer, the term of this patent is extended or adjusted under 35 U.S.C. 154(b) by 177 days.

(21) Appl. No.: 13/169,751

(22) Filed: Jun. 27, 2011

(65) Prior Publication Data
US 2012/0183766 A1  Jul. 19, 2012

(30) Foreign Application Priority Data
Jan. 17, 2011 (CN) .......................... 2011 1 0009229

(51) Int. Cl.
*B32B 9/00* (2006.01)

(52) U.S. Cl.
USPC ........... 428/336; 428/216; 428/469; 428/472; 428/698

(58) Field of Classification Search
USPC .......................... 428/216, 336, 469, 472, 698
See application file for complete search history.

(56) References Cited

U.S. PATENT DOCUMENTS 5,085,926 A * 2/1992 Iida et al. ....................... 428/216
6,833,194 B1 * 12/2004 O'Shaughnessy ............ 428/472
7,445,273 B2 * 11/2008 Veerasamy et al. ........... 428/332

FOREIGN PATENT DOCUMENTS

JP    09-255371    *    9/1997

* cited by examiner

*Primary Examiner* — Archene Turner
(74) *Attorney, Agent, or Firm* — Altis Law Group, Inc.

(57) ABSTRACT

A coated article is provided. The coated article includes a substrate, a base layer formed on the substrate; a nickel oxynitride layer formed on the base layer; and a silicon nitride layer formed on the nickel oxynitride layer. The nickel oxynitride layer and silicon nitride layer can protect the substrate from oxidizing at high temperature, which effectively extend the use time of the coated article. A method for making the coated article is also described.

6 Claims, 2 Drawing Sheets

US 8,609,240 B2

COATED ARTICLE AND METHOD FOR MAKING SAME

BACKGROUND

1. Technical Field

The present disclosure relates to a coated article and a method for making the coated article.

2. Description of Related Art

Die steel has been widely used in forging, stamping, cutting, die-casting and other processes. The die steel is usually required to endure oxidation at high temperatures. Typically, physical vapor deposition technology has been used to manufacture coatings with anti-oxidation performance Coatings of transition metal nitride and carbide are one of the most popular choices for the surface hardening material of the die steel due to its high hardness and good chemical stability. However, there are shortcomings, such as high brittleness, high residual stress and poor adhesion with the substrate. When the temperature is high, coatings of transition metal nitride and carbide may be subjected to oxidation.

Therefore, there is room for improvement within the art.

BRIEF DESCRIPTION OF THE FIGURE

Many aspects of the coated article and the method for making the coated article can be better understood with reference to the following drawings. The components in the drawings are not necessarily drawn to scale, the emphasis instead being placed upon clearly illustrating the principles of the coated article and the method. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 1:
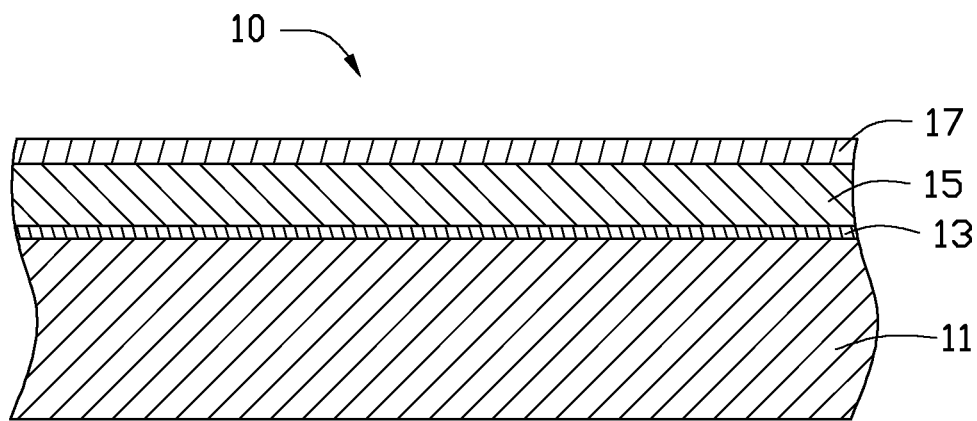
FIG. 1 is a cross-sectional view of an exemplary embodiment of a coated article.

FIG. 1 shows a coated article 10 according to an exemplary embodiment. The coated article 10 includes a substrate 11, a base layer 13 formed on the substrate 11, a nickel oxynitride (NiON) layer 15 formed on the base layer 13 and a silicon nitride (SiN) layer 17 formed on the nickel oxynitride layer 15.

The substrate 11 may be made of stainless steel or die steel.

The base layer 13 is a nickel layer. An environmentally friendly vacuum sputtering process may form the base layer 13. The base layer 13 has a thickness of about 0.1 μm to about 0.2 μm.

An environmentally friendly vacuum sputtering process may form the nickel oxynitride layer 15. In the nickel oxynitride layer 15, the atomic percentage of nickel is from about 45% to about 70%, the atomic percentage of oxygen is from about 20% to about 45% and the atomic percentage of nitrogen is from about 20% to about 45%. The nickel oxynitride layer 15 has a thickness of about 0.6 μm to about 1.2 μm. The nickel oxynitride layer 15 is composed of small nanocrystals and the gap between the nanocrystals is small, thus the nickel oxynitride layer 15 is dense, which can effectively delay the outside oxygen penetration towards the substrate 11.

An environmentally friendly vacuum sputtering process may form the silicon nitride layer 17. The silicon nitride layer 17 may have a high hardness and good wear resistance, thus effectively protecting the nickel oxynitride layer 15 from scratches. The silicon nitride layer 17 has a thickness of about 0.5 μm to about 1.0 μm.

The nickel oxynitride layer 15 and silicon nitride layer 17 can protect the substrate 11 from oxidizing at high temperature, which effectively extend the use time of the coated article 10.

A method for making the coated article 10 may include the following steps:

The substrate 11 is pretreated. The pre-treating process may include the following steps:

The substrate 11 is positioned in an ultrasonic cleaning device (not shown) with ethanol to be cleaned.

Figure 2:
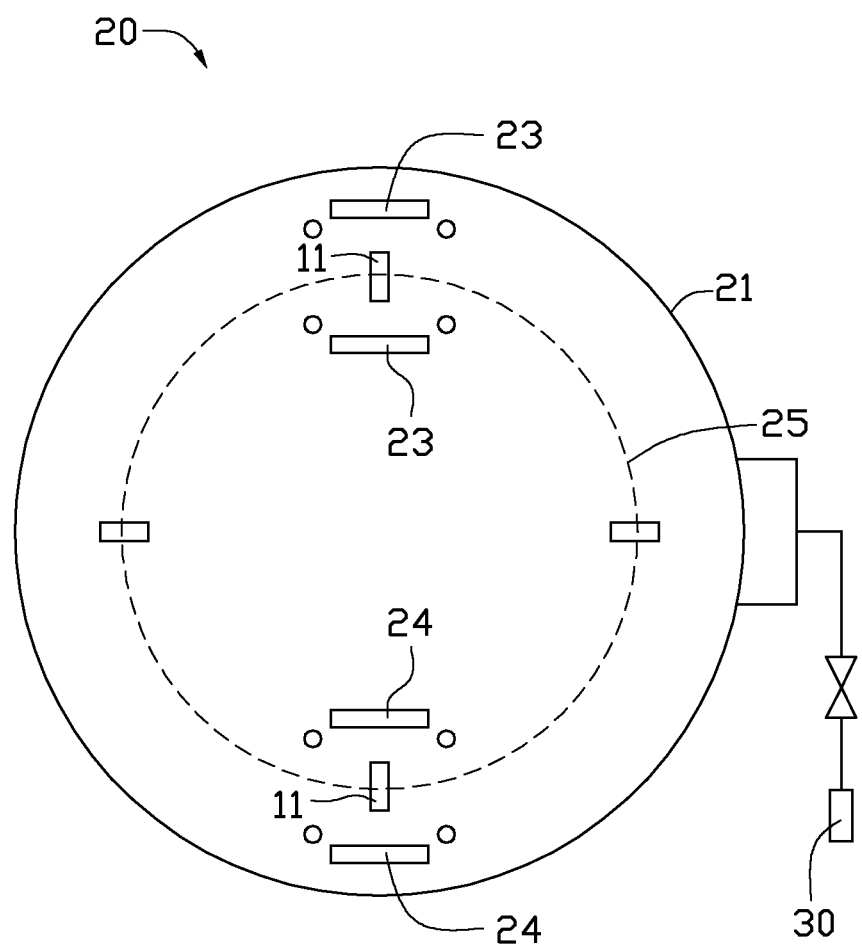
FIG. 2 is a schematic view of a vacuum sputtering device for processing the coated article in FIG. 1.

FIG. 2 shows a vacuum sputtering device 20, which includes a vacuum chamber 21 and a vacuum pump 30 connected to the vacuum chamber 21. The vacuum pump 30 is used for evacuating the vacuum chamber 21. The vacuum chamber 21 has a pair of nickel targets 23, a pair of silicon targets 24 and a rotary rack (not shown) positioned therein. The rotary rack holds the substrate 11 to revolve along a circular path 25, and the substrate 11 also revolves on its own axis while revolving along the circular path 25.

The substrate 11 is plasma cleaned. The substrate 11 is positioned in the rotary rack of the vacuum chamber 21. The vacuum chamber 21 is then evacuated to $3.0 \times 10^{-5}$ Pa. Argon gas (abbreviated as Ar, having a purity of about 99.999%) is used as sputtering gas and is fed into the vacuum chamber 21 at a flow rate of about 500 standard-state cubic centimeters per minute (sccm). A negative bias voltage in a range of from about −200 volts (V) to about −500 V may be applied to the substrate 11, then high-frequency voltage is produced in the vacuum chamber 21 and the Ar is ionized to plasma. The plasma then strikes the surface of the substrate 11 to clean the surface of the substrate 11. The plasma cleaning of the substrate 11 takes about 3 minutes (min) to about 10 min The plasma cleaning process will enhance the bond between the substrate 11 and the base layer 13.

The base layer 13 is vacuum sputtered on the pretreated substrate 11. Vacuum sputtering of the base layer 13 is implemented in the vacuum chamber 21. The vacuum chamber 21 is evacuated to $8.0 \times 10^{-3}$ Pa and heated to about 100° C. to about 150° C. Ar is used as sputtering gas and is fed into the vacuum chamber 21 at a flow rate of about 150 sccm to about 300 sccm. The nickel targets 23 are powered on and set from about 8 kw to about 10 kw. A negative bias voltage of about −100 V to about −300 V is applied to the substrate 11 and the duty cycle is 50%. The depositing of the base layer 13 takes about 5 min to about 10 min.

The nickel oxynitride layer 15 is vacuum sputtered on the base layer 13. Vacuum sputtering of the nickel oxynitride layer 15 is implemented in the vacuum chamber 21. Oxygen ($O_2$) and nitrogen ($N_2$) are used as reaction gases and are fed into the vacuum chamber 21 at a flow rate of about 40 sccm to about 100 sccm and about 30 sccm to about 70 sccm respectively, other experiment conditions is the same with vacuum sputtering of the base layer 13. The depositing of the nickel oxynitride layer 15 takes about 30 min to about 60 min.

The silicon nitride layer 17 is vacuum sputtered on the nickel oxynitride layer 15. Vacuum sputtering of the silicon nitride layer 17 is implemented in the vacuum chamber 21. Nitrogen is used as reaction gas and is fed into the vacuum chamber 21 at a flow rate of about 40 sccm to about 120 sccm, and Ar is used as sputtering gas and is fed into the vacuum chamber 21 at a flow rate of about 150 sccm to about 200 sccm. The silicon targets 24 are powered on and set from about 4 kw to about 6 kw and the duty cycle is 50%. A negative bias voltage of about −30 V to about −50 V is applied to the substrate 11. The depositing of the silicon nitride layer 17 takes about 1 hour to about 2 hours.

EXAMPLES

Experimental examples of the present disclosure are described as followings.

Example 1

The vacuum sputtering device 20 used in example 1 was a medium frequency magnetron sputtering device (model No. SM-1100H) manufactured by South Innovative Vacuum Technology Co., Ltd. located in Shenzhen, China.

The substrate 11 was made of 316 stainless steel.

Plasma cleaning: Ar was fed into the vacuum chamber 21 at a flow rate of about 500 sccm. A negative bias voltage of about −500 V was applied to the substrate 11. The plasma cleaning of the substrate 11 took about 10 min.

Sputtering to form the base layer 13: The vacuum chamber 21 was heated to about 120° C. Ar was fed into the vacuum chamber 21 at a flow rate of about 150 sccm. The power of the nickel targets 23 was 8 kw and a negative bias voltage of −200 V was applied to the substrate 11. The depositing of the base layer 13 took 5 min The base layer 13 had a thickness of about 0.1 µm.

Sputtering to form the nickel oxynitride layer 15: Oxygen and nitrogen were fed into the vacuum chamber 21 at a flow rate of about 80 sccm and 60 sccm, respectively; other experiment conditions was the same with vacuum sputtering of the base layer 13. The depositing of the nickel oxynitride layer 15 took 30 min. The nickel oxynitride layer 15 had a thickness of about 0.6 µm.

Sputtering of the silicon nitride layer 17: Ar and nitrogen were fed into the vacuum chamber 21 at a flow rate of about 150 sccm and 120 sccm, respectively. The power of the silicon targets 24 was 5 kw and a negative bias voltage of −50 V was applied to the substrate 11. The depositing of the silicon nitride layer 17 took 60 min. The silicon nitride layer 17 had a thickness of about 0.5 µm.

Example 2

The vacuum sputtering device 20 used in example 2 was the same in example 1.

The substrate 11 was made of 316 stainless steel.

Plasma cleaning: Ar was fed into the vacuum chamber 21 at a flow rate of about 500 sccm. A negative bias voltage of −500 V was applied to the substrate 11. The plasma cleaning of the substrate 11 took about 10 min.

Sputtering to form the base layer 13: The vacuum chamber 21 was heated to about 120° C. Ar was fed into the vacuum chamber 21 at a flow rate of about 150 sccm. The power of the nickel targets 23 was 8 kw and a negative bias voltage of −200 V was applied to the substrate 11. The depositing of the base layer 13 took 10 min. The base layer 13 had a thickness of about 0.2 µm.

Sputtering of the nickel oxynitride layer 15: Oxygen and nitrogen were fed into the vacuum chamber 21 at a flow rate of about 40 sccm and 30 sccm, respectively; other experiment conditions was the same with vacuum sputtering of the base layer 13. The depositing of the nickel oxynitride layer 15 took 60 min The nickel oxynitride layer 15 had a thickness of about 1.2 µm.

Sputtering to form the silicon nitride layer 17: Ar and nitrogen were fed into the vacuum chamber 21 at a flow rate of about 150 sccm and 80 sccm, respectively. The power of the silicon targets 24 was 4 kw and a negative bias voltage of −50 V was applied to the substrate 11. The depositing of the silicon nitride layer 17 took 120 min. The silicon nitride layer 17 had a thickness of about 1.0 µm.

Results of the Above Examples

The coated articles 10 illustrated in example 1 and 2 both have high-temperature oxidation and abrasion tests performed on them.

High-temperature oxidation test: the test device used was a tube furnace, heating rate was 10° C./min, heating temperature was 800° C., holding time was 10 h. The coated articles 10 illustrated in example 1 and 2 both showed no oxidation damage and no peeling of superficial layers.

Abrasion test: test device used was a linear wear tester, the load was 1 kg, stroke length was 2.0 inch, wear rate was 25 times/min. The coated articles 10 illustrated in example 1 and 2 both showed no peeling after being worn 25 times.

It is believed that the exemplary embodiment and its advantages will be understood from the foregoing description, and it will be apparent that various changes may be made thereto without departing from the spirit and scope of the disclosure or sacrificing all of its advantages, the examples hereinbefore described merely being preferred or exemplary embodiment of the disclosure.

What is claimed is:

1. A coated article, comprising:
   a substrate;
   a base layer formed on the substrate;
   a nickel oxynitride layer formed on the base layer, the nickel oxynitride layer being composed of nanocrystals, and the nickel oxynitride layer delaying outside oxygen penetration towards the substrate; and
   a silicon nitride layer directly formed on the nickel oxynitride layer.

2. The coated article as claimed in claim 1, wherein the substrate is made of stainless steel or die steel.

3. The coated article as claimed in claim 1, wherein the base layer is a nickel layer formed by magnetron sputtering process and has a thickness of about 0.1 µm to about 0.2 µm.

4. The coated article as claimed in claim 1, wherein in the nickel oxynitride layer the atomic percentage of nickel is from about 45% to about 70%, the atomic percentage of oxygen is from about 20% to about 45% and the atomic percentage of nitrogen is from about 20% to about 45%.

5. The coated article as claimed in claim 1, wherein the nickel oxynitride layer is formed by magnetron sputtering process and has a thickness of about 0.5 µm to about 1.0 µm.

6. The coated article as claimed in claim 1, wherein the silicon nitride layer is formed by magnetron sputtering process and has a thickness of about 0.5 µm to about 1.5 µm.

* * * * *